US006560246B1

(12) United States Patent
Stepanov et al.

(10) Patent No.: US 6,560,246 B1
(45) Date of Patent: May 6, 2003

(54) BRILLOUIN/ERBIUM FIBER LASER CURRENT MONITOR USING ELLIPTICALLY POLARIZING FIBER

(75) Inventors: Dmitrii Yu Stepanov, Sulwich (AU); Ian M. Bassett, Wollstonecraft (AU); Gregory J. Cowle, Corning, NY (US)

(73) Assignee: The University of Sydney, Sydney (AU)

( * ) Notice: Subject to any disclaimer, the term of this patent is extended or adjusted under 35 U.S.C. 154(b) by 0 days.

(21) Appl. No.: 09/509,835

(22) PCT Filed: Oct. 23, 1998

(86) PCT No.: PCT/AU98/00886

§ 371 (c)(1),
(2), (4) Date: Nov. 27, 2000

(87) PCT Pub. No.: WO99/22204

PCT Pub. Date: May 6, 1999

(30) Foreign Application Priority Data

Oct. 24, 1997  (AU) ............................................. PO9989

(51) Int. Cl.[7] ............................................. H01S 3/30

(52) U.S. Cl. ............................. 372/6; 372/27; 372/94; 372/105; 372/106; 372/70

(58) Field of Search ....................... 372/6, 92, 94, 372/27, 105, 106, 70

(56) References Cited

U.S. PATENT DOCUMENTS

| 5,617,434 | A | * | 4/1997 | Tamura et al. | ................. | 372/6 |
| 5,778,014 | A | * | 7/1998 | Islam | ........................... | 372/6 |
| 9,176,152 |   | * | 11/2002 | Parolari et al. | ............ | 385/122 |

FOREIGN PATENT DOCUMENTS

EP  0 486 930   5/1992

OTHER PUBLICATIONS

G.J. Cowle et al.., "Brillouin/Erbium Fiber Lasers", Journal of Lightwave Technology, vol. 15, No. 7, pp. 1198–1204, (1997), OSC Publication, New York.
G.J. Cowle et al., "Hybrid Brillouin/erbium fiber laser", Optics Letters, vol. 21, No., 16, pp. 1250–1252, (1996), Optical Society of America.
I.G. Clarke, "Temperature–stable spun elliptical–core optical–fiber current transducer", Optical Letters vol. 18, No. 2, pp. 158–160, (1993), Optical Society of America.
B. Edvold et al., "High–birefringent and high–gain erbium–doped polarization–maintaining fiber", SPIE, vol. 2289 pp. 69–77, (1994), LYCOM A/S, Denmark.
J. Vobian et al., "Dispersion–compensating fibers with high birefringence", Symposium on Optical Fibre Measurements (1996), pp 93–96, (NIST Special Publication 905).
S.P. Smith et al., "Narrow–linewidth stimulated Brillouin fiber laser and applications", Optics Letters, vol. 16, No. 6, pp. 393–395, (1991), Research Laboratory for Electronics, Massachusetts Inst. Of Technology.
Derwent Abstract Accession No. 97–265504/24, Class L03. JP 09 092914 A, Furukawa Electric Co. Ltd., (1997)—Abstract.
Derwent Abstract Accession No. 93–123171/15, Class S02, JP 05 063265 A, Nippon Telegraph and Telephone Corp. (1993)—Astract.

* cited by examiner

*Primary Examiner*—Leon Scott, Jr.
(74) *Attorney, Agent, or Firm*—Foley & Lardner

(57) ABSTRACT

A laser arrangement comprising a ring cavity at least two gain portions in said ring cavity, an input-output coupling connected to said ring cavity, a discriminator means connected in said ring cavity and adapted to discriminate between a pumping signal and an output signal and pumping means for providing said pumping signal and connected to said gain portions of said ring cavity such that, upon activation of said pumping means, said laser arrangement operates as a laser producing a laser output at said input-output coupling.

10 Claims, 5 Drawing Sheets

BRILLOUIN/ERBIUM FIBER LASER CURRENT MONITOR USING ELLIPTICALLY POLARIZING FIBER

FIELD OF THE INVENTION

The present invention relates to a Brillouin/Erbium laser arrangement and in particular, to a bidirectional single elliptical polarization high efficiency and output power all fibre laser arrangement and its application to current sensing.

BACKGROUND OF THE INVENTION

Brillouin fibre lasers (BFL) are particularly useful in fibre sensors due to extremely narrow linewidths and they have been the subject of considerable research at a number of different wavelengths [S. P. Smith, F. Zarinetchi, and S. Ezekiel, Opt. Lett., vol. 16, p. 393,1991]. They have found applications such as gyroscopes [S. Huang, K. Toyama, B. Y. Kim, and H. J. Shaw, Opt, Lett., vol. 18, pp. 555–557, 1993] and current sensors [A. Küng, P. -A. Nicati, and P. A. Robert, IEEE Photon. Technol, Lett., Vol. 8, p. 1680, 1996]. Such devices are realized by using two counter-propagating Brillouin lasers sharing the same fibre ring resonator and experiencing different apparent cavity lengths due to non-reciprocal phaseshifts induced by either Sagnac or Faraday effects. These two counter-propagating Brillouin lasers will therefore oscillate at slightly different optical frequencies and the optical beat frequency will be linearly proportional to either the rotation rate or the electric current. These types of sensors have much simpler signal processing than more conventional devices [I. G. Clarke, Opt. Lett., vol. 18, pp. 158–160, 1993] based on Sagnac loop. To achieve maximum sensitivity of the current sensor to the Faraday effect it is necessary to keep the laser polarization states circular although some degree of ellipticity is acceptable.

The conventional technique to produce a BFL is to construct a critically coupled fibre resonator, required because of the small magnitude of the Brillouin gain [G. P. Agrawal, in Nonlinear Fibre Optics, Academic Press, San Diego, Calif., 1989]. Principal disadvantages of critically coupled BFLs include the small output power that can be achieved, the requirement of cavity matching to the pump signal, and the difficulty in incorporating intra-cavity elements because of their associated loss.

Brillouin/erbium fibre lasers (BEFL) [G. J. Cowle and D. Yu. Stepanov, J. Lightwave Technol., VOL. 15, PP. 1198–1204, 1997] combine Brillouin gain as used in BFLs with gain from erbium-doped fibre (EDF) to yield laser sources with unique properties. Narrow bandwidth nonlinear gain from stimulated Brillouin scattering in Single Mode Optical Fibre (SMOF) precisely determines the wavelength of operation, and gain in erbium-doped fibre (EDF) allows efficient operation and large power extraction. BEFLs do not require cavity matching to the Brillouin pump frequency since the BEFL resonator is not critically coupled. The Brillouin pump can be removed from the laser cavity to avoid spurious injection locking. In [G. J. Cowle and D. Yu. Stepanov, Opt. Lett., vol. 21, pp. 1250–1252, 1996] the laser cavity was made non-resonant in the direction of the Brillouin pump injection using a pigtailed bulk isolator. However, such an approach is undesirable for the sensing applications which require bidirectional operation.

SUMMARY OF THE INVENTION

It is an object of at least preferred embodiments of the present invention to provide an improved laser arrangement which overcomes the disadvantages of the aforementioned laser arrangements and is further preferably capable of being applied to electric current measurements.

In accordance with a first aspect of the present invention there is provided a laser arrangement comprising a ring cavity, at least two gain portions in said ring cavity, an input-output coupling connected to said ring cavity, a discriminator means connected in said ring cavity adapted to discriminate between a pumping signal and an output signal, and pumping means for providing said pumping signal and connected to said gain portions of said ring cavity such that, upon activation of said pumping means, said laser arrangement operates as a bidirectional laser producing a laser output at said input-output coupling.

In one embodiment, the laser arrangement comprises a ring cavity with Brillouin gain portions, a bidirectional optical amplifier and an elliptical polarizer interposed in predetermined portions of the ring cavity, input-output couplings connected to the ring cavity, and pumping means connected to the Brillouin gain portions of the ring cavity, such that, upon activation of the pumping means, the laser arrangement operates as a bidirectional laser and produces an output at said input-output couplings.

Preferably the laser arrangement acts as a Brillouin laser for obtaining a bidirectional single polarization high power output at the frequencies shifted down from the frequencies of the pumping means by an amount determined by the Brillouin shift in the glass fibre.

In accordance with the second aspect of the present invention the aforementioned laser arrangement is applied to the measurement of an electric current by measuring the optical beat frequency between counterpropagating waves in the ring cavity. The optical beat frequency being linearly proportional to the current value.

Preferably, the optical amplifier is formed from the one piece of rare earth doped optical fibre with a separate pumping means connected to the rare earth doped optical fibre.

Preferably, the elliptical polarizer is formed from the one piece of spun highly birefringent polarizing fibre (PSHBF) polarizing in the wavelength range of the laser operation [I. G. Clarke, Opt. Lett., vol. 18, pp 158–160, 1993].

The Brillouin pump should be removed from the ring cavity to enable the laser to be operated in the BEFL mode. This can be achieved using a number of different techniques with the preferred embodiment utilising a polarizing spun highly birefringent fibre. Alternatively, a blazed grating or other discriminators, could be utilized, provided that the discriminator does not inhibit the bidirectional operation of the laser arrangement.

In broad terms, the preferred embodiment of the present invention provides a Brillouin laser, comprising Brillouin gain portions and a rare-earth doped optical amplifier inserted into a ring cavity.

More specifically, the preferred embodiment of the present invention provides a bidirectional single polarization high output power laser arrangement at the frequencies shifted down from the frequencies of the pumping means by an amount determined by the Brillouin shift in the glass fibre, comprising Brillouin gain portions for obtaining gain in opposite directions at shifted frequencies, input/output couplers to provide input/output coupling and feedback through the ring cavity, an optical amplifier to compensate for the ring cavity losses, and a polarizing spun highly birefringent fibre (PSHBF) to prevent injection of the Brillouin pumping means into the optical amplifier.

The concept of the laser arrangement is as follows: First increase the gain of the optical amplifier to a level just below that required for the arrangement to operate as a laser. Elliptically polarized light from an external narrow linewidth laser is then injected into the predetermined portions of the ring cavity to stimulate Brillouin scattering in both clockwise and counterclockwise directions. In scalar-type backward stimulated Brillouin scattering, circularly or elliptically polarized Brillouin pump is reflected into the Stokes wave as if from a conventional mirror [B. Ya. Zeldovich, N. E. Pilipetsky, and V. V. Shkunov, in *Principles of Phase Conjugation*, Springer-Verlag, Berlin, 1985], ie. with the reversal of rotation sense and preservation of the orientation of the ellipse. With sufficient intensity of the injected Brillouin pump an elliptically polarized Brillouin signal is generated in the opposite direction and with the opposite rotation sense supported by the PSHBF at a frequency separated from the injected signal by the Stokes shift and it will eventually have sufficient gain to reach a lasing threshold by virtue of the combination of the Brillouin gain and the gain in the optical amplifier.

Preferable key features of the laser are that it does not need a low loss resonator, instead using an optical amplifier to equalise the resonator losses, which allows it to obtain high power output, and it does not require an optical isolator, instead using a PSHBF to isolate the Brillouin pump, thus allowing for the bidirectional operation. The PSHBF prevents both depletion of the optical amplifier gain by an injection locking to the Brillouin pumping means and provides feedback for the Brillouin signal.

In a preferred embodiment, the Brillouin gain portions are lengths of single mode optical fibre and the optical amplifier comprises a section of erbium doped fibre which is optically pumped through a wavelength division multiplexing (WDM) coupler. With sufficient pump power applied, the ring laser would operate as a normal erbium doped fibre ring laser. However, in this embodiment, laser action is originated from signals shifted down in frequency by an amount determined by the Brillouin shift in the glass fibre, generated from an external narrow linewidth laser source. The Brillouin pump signals injected in opposite directions are non-resonant in the laser cavity as they are blocked by the PSHBF in the ring and hence do not enter the EDF section of the ring. However the Brillouin signals generated in the opposite directions with respect to the corresponding Brillouin pumps are amplified by the amplifying section of the ring. The polarizing spun highly birefringent fibre prevents the ring from operating as an injection locked laser and sets the internal polarization state of the laser.

Such an arrangement has advantages in producing bidirectional high output power narrow linewidth laser sources for fibre sensors. The laser has only one elliptically polarized eigenstate in both clockwise and counter-clockwise directions. This makes the laser very attractive for current sensing using the Faraday effect. Additionally, the laser also has application in the gyroscope area. Elliptical polarization of the counter propagating laser eigenstates also ensures that spatial hole burning in the amplifying section of the laser is reduced as the standing wave pattern is close to a helicoidal shape and thus the light field intensity approaches uniformity along the doped fibre.

To measure nonreciprocal phaseshifts induced by the Faraday effect when an electric current is applied to a conducting coil wound around the PSHBF section of the laser, the frequency of the optical beat produced by the counter-propagating lasing modes can be analysed using a radio-frequency spectrum analyser (RFSA). For experimental convenience and to prevent possible lock-in of the counter-propagating lasing modes at low currents, the optical beat frequency in this embodiment is preferably biased using a frequency shifter by shifting the frequency of one of the Brillouin pumps, thus shifting the corresponding Brillouin gain maximum. Given the sweep time τ of the RFSA is much longer than the electric current waveform period T and the ratio τ/T is known, the waveform can be reconstructed from the RFSA spectrum and the current can be measured.

BRIEF DESCRIPTION OF THE DRAWINGS

Further features and advantages of the present invention will become apparent from the following description of embodiments thereof, by way of example only with reference to the accompanying drawings, in which.

DESCRIPTION OF PREFERRED AND OTHER EMBODIMENTS

Figure 1:
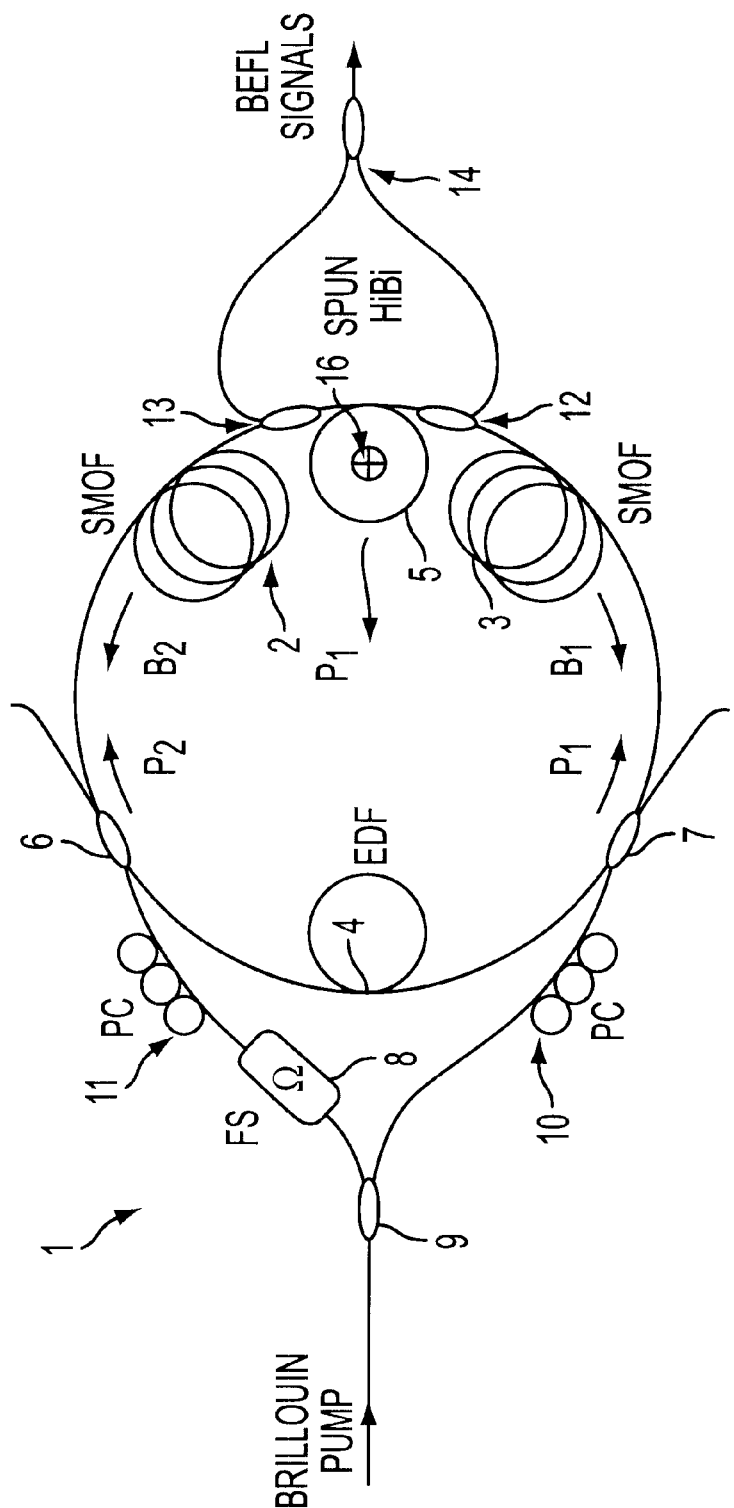
FIG. 1 is a schematic diagram of a laser arrangement constructed in accordance with an embodiment of the present invention.

FIG. 1 schematically illustrates a Brillouin/Erbium fibre laser arrangement 1 which includes lengths of single mode-optical fibre 2 and 3, a section of erbium doped fibre 4, and a polarizing spun highly birefringent fibre 5. The arrangement also comprises input couplers 6 and 7 to provide input coupling and to complete the ring. A wavelength division multiplexing (WDM) fibre coupler (not shown) is coupled to and provides pumping of the section of erbium doped fibre 4.

In a first example, the resonator was formed by a fused fibre coupler which couples 50% of light out of the ring, a 5 m length of Er/Al doped (250 ppm) fibre, WDM coupler to allow pumping of the doped fibre with 980 nm light from a pigtailed semiconductor laser, two 50 m sections of single mode optical fibre 2, 3 and a 50 m polarizing spun highly birefringent fibre 5. A copper wire 16 with 1.5 cm² cross section was wound around the PSHBF 5 and an AC electric current was applied to the wire.

The laser was pumped with a 980-nm pump laser diode through a 980/1550 WDM located in the ring. Brillouin pumps were injected into the laser cavity through the input couplers 6 and 7 in opposite directions, with one pump frequency shifted by 27 MHz using an acousto-optic frequency shifter 8. This allowed the application of a bias to the optical beat frequency. A tunable semiconductor laser diode with a 0.001 nm setting accuracy was used as a Brillouin pump which was split into two channels using a splitter 9. Its wavelength was tuned close to the wavelength of spurious lasing in the absence of the Brillouin pump.

Figure 2:
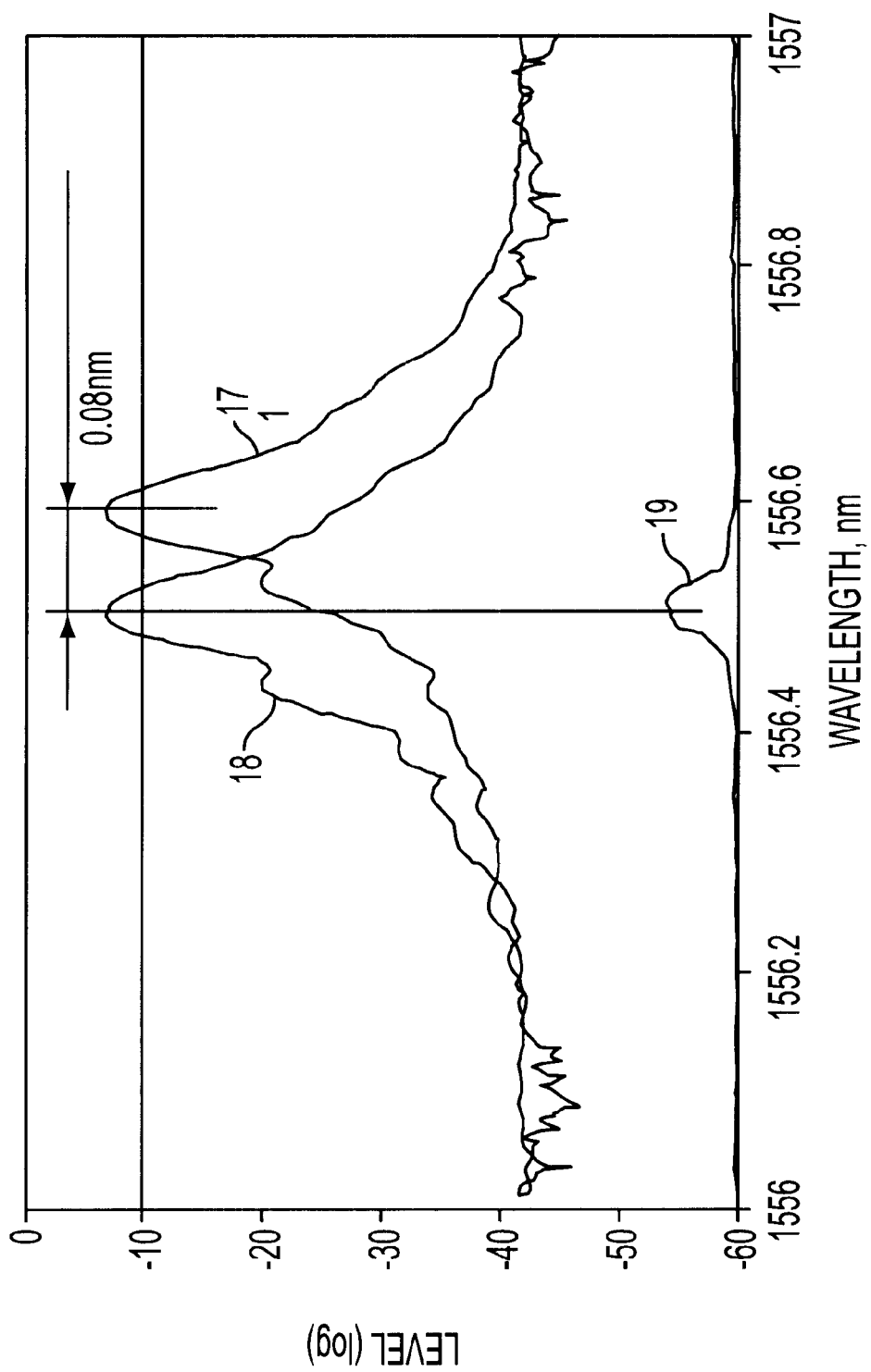
FIG. 2 shows the optical spectrum of mixed Brillouin pump and Brillouin/erbium fibre laser signals. The Brillouin pump is shown for two orthogonal polarization states, with one polarization state blocked by the PSHBF.

FIG. 2 illustrates a graph of the optical spectrum of the resultant laser output mixed with the optical spectra of the two orthogonal polarizations of the Brillouin pumps adjusted using polarization controllers 10 and 11 at the input couplers 6 and 7 to provide either minimum or maximum transmission through the PSHBF 5. The optical spectra were observed using taps 12, 13, a mixer 14 subsequently connected to an optical spectrum analyser (OSA). The Brillouin signals were Stokes shifted by about 0.08 nm from the Brillouin pump wavelengths and the operation of the laser was observed to be very robust. The curve 17 measures the optical spectra of the BEFL output with the curve 18 plotting maximized transmission and the curve 19 plotting the minimized transmission through the PSHBF of the residual Brillouin pumps. The counterpropagating signals are not distinguishable in the optical spectra as the frequency separation of 27 MHz falls far below the resolution of about 10 GHz of the OSA employed. From the measurements of the Brillouin pump transmission, the extinction ratio of the polarizing spun highly birefringent fibre was estimated to be better than 45 dB.

The arrangement 1 of FIG. 1 has a potential tunability over a certain wavelength range by tuning the Brillouin pump wavelengths within the range of spurious lasing.

Figure 3:
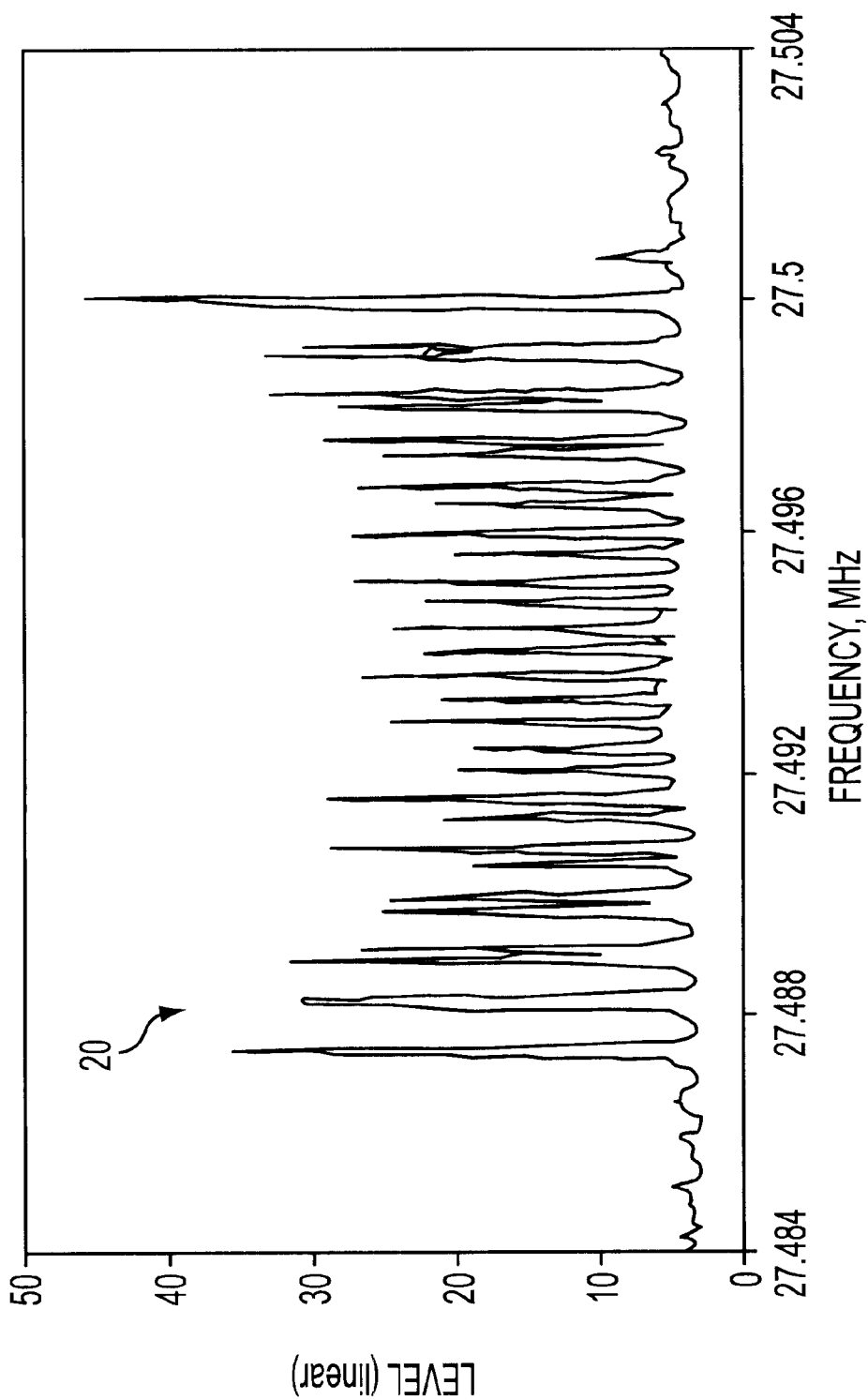
FIG. 3 illustrates a typical optical beat frequency spectrum measured using an RFSA.

FIG. 3 illustrates a typical optical beat frequency spectrum of the BEFL output when a 50 Hz AC electric current was applied to the copper wire coil 16. The spectrum was measured using an RFSA. The sweep time of the RFSA trace was 10 s. The spike-like shape of the spectrum 20 is caused by the stroboscopic effect as the sweep time of the RFSA in this particular case was an even number of the electric current periods.

Figure 4:
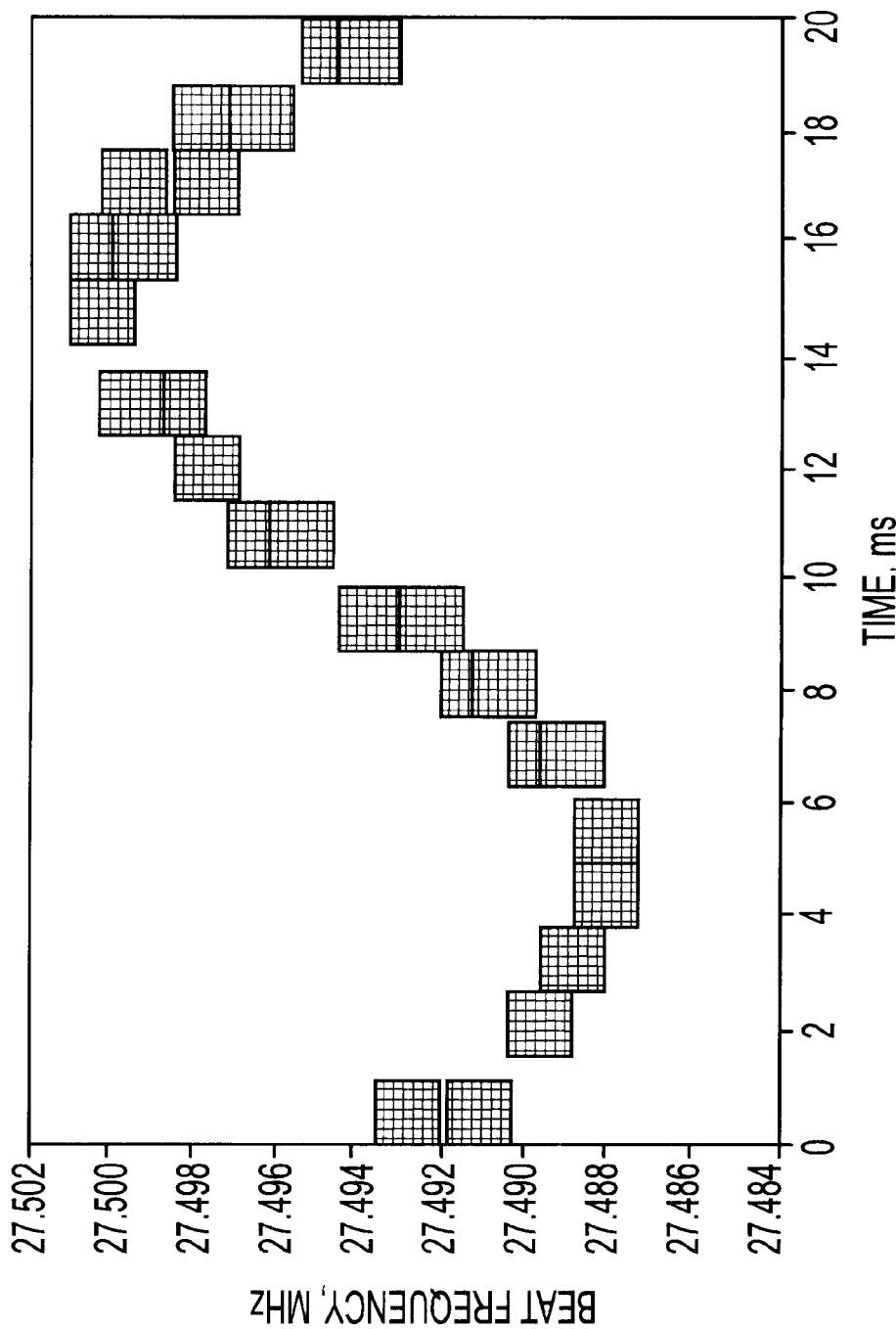
FIG. 4 illustrates an AC current waveform reconstructed from the optical beat frequency spectrum.
Figure 5:
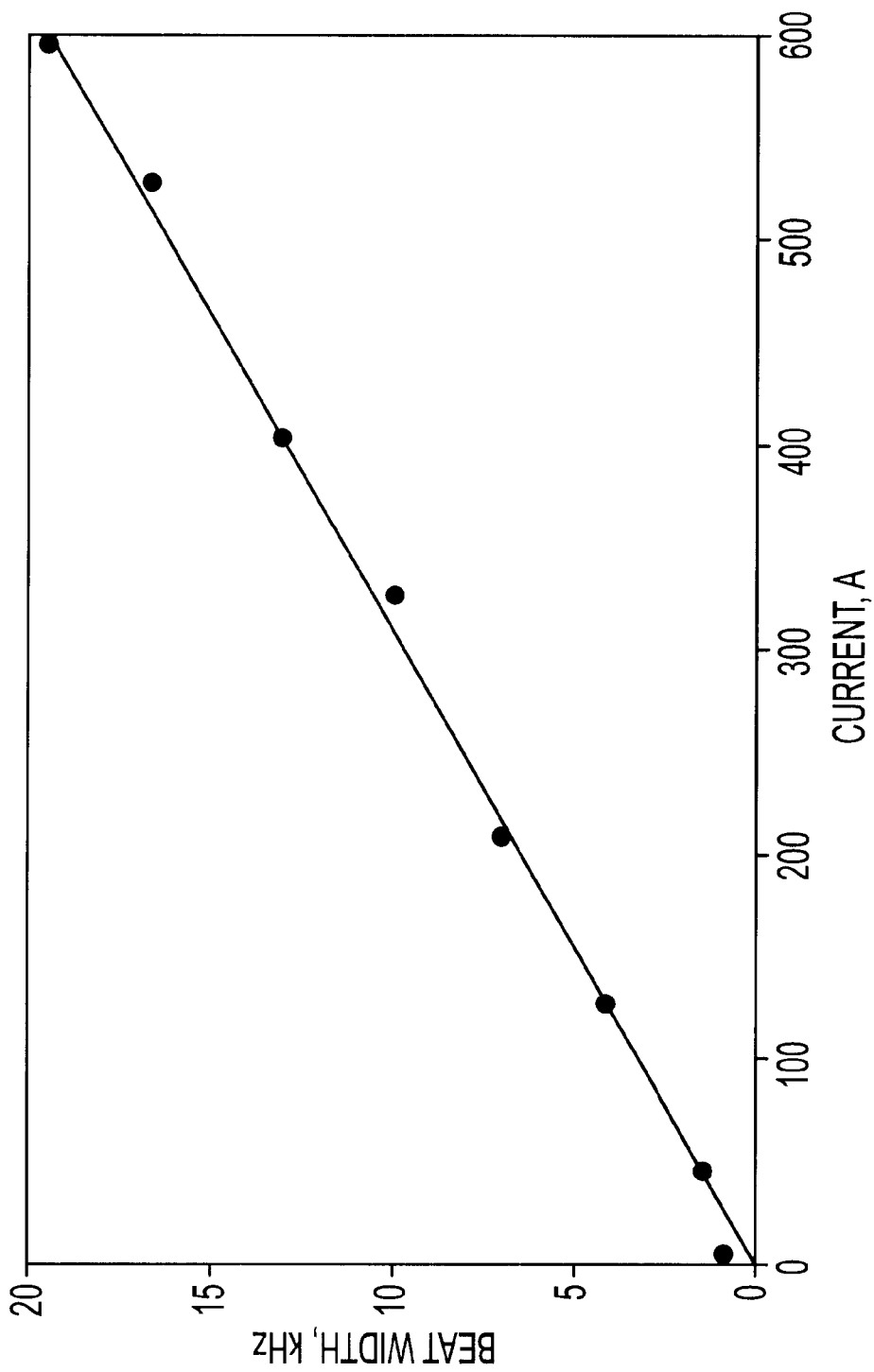
FIG. 5 presents the measured value of the optical beat frequency width vs the mean value of the electric current.

Since during the measurements both the AC current and the measured beat frequency are functions of time it is possible to reconstruct the AC waveform and the result of this reconstruction is shown in FIG. 4. Further, the amplitude of the waveform vs mean value of the electric current applied is plotted in FIG. 5 which clearly illustrates its linear nature.

It will be further appreciated that the present invention is not limited to an all fibre arrangement and that other elliptical polarizers and ring cavities may be employed.

It will be further appreciated that the present invention is not limited to an elliptically polarizing spun highly birefringent fibre and that other polarizing fibres may be employed It will be further appreciated that other signal processing techniques can be employed.

It will be further appreciated that other sensor applications of the laser arrangement such as gyroscopes can be utilized.

It will be appreciated by persons skilled in the art that numerous variations and/or modifications may be made to the invention as shown in the specific embodiment without departing from the spirit or scope of the invention as broadly described. The present embodiment is, therefore, to be considered in all respects as illustrative and not restrictive.

We claim:

1. A laser arrangement comprising:

a ring cavity;

at least two gain portions in said ring cavity;

an input-output coupling connected to said ring cavity;

a discriminator means connected in said ring cavity and adapted to discriminate between a pumping signal and an output signal; and pumping means for providing said pumping signal and connected to said gain portions of said ring cavity such that, upon activation of said pumping means, said laser arrangement operates as a bidirectional laser producing a laser output at said input-output coupling.

2. A laser arrangement as claimed in claim 1 wherein said discriminator means comprises an elliptical polarizer.

3. A laser arrangement as claimed in claim 2 wherein said ring cavity and said elliptical polarizer comprise optical fibre.

4. A laser arrangement as claimed in claim 3 wherein said elliptical polarizer comprises a polarising spun highly birefringent fibre.

5. A laser arrangement as claimed in claim 2 where said elliptical polarizer acts as a filter to remove Brillouin pumping means from the laser cavity and to provide a single polarization output.

6. A laser arrangement as claimed in claim 1 wherein one of the gain portions comprises a rare-earth doped fibre.

7. A laser arrangement as claimed in claim 6 wherein said rare earth is erbium.

8. A laser arrangement as claimed in claim 1 wherein one of the gain portions comprises a single mode optical fibre (SMOF).

9. A laser arrangement as claimed in claim 8 wherein the pumping means connected to the SMOF gain sections comprises a narrow linewidth laser source and acts as Brillouin pumps for signals propagating in counter directions.

10. A laser arrangement as claimed in claim 1 wherein said laser arrangement is applied to electric current or spatial rotation measurements.

* * * * *